(12) United States Patent
Tamura et al.

(10) Patent No.: US 9,960,610 B2
(45) Date of Patent: May 1, 2018

(54) VOLTAGE DETECTING DEVICE, VOLTAGE DETECTING METHOD, AND BATTERY PACK SYSTEM

(71) Applicant: FUJITSU TEN LIMITED, Kobe-shi, Hyogo (JP)

(72) Inventors: Sho Tamura, Kobe (JP); Hiroyuki Fuji, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 159 days.

(21) Appl. No.: 15/044,363

(22) Filed: Feb. 16, 2016

(65) Prior Publication Data

US 2016/0254685 A1    Sep. 1, 2016

(30) Foreign Application Priority Data

Feb. 27, 2015  (JP) ................. 2015-039206

(51) Int. Cl.

| | | |
|---|---|---|
| G01N 27/416 | (2006.01) | |
| H02J 7/00 | (2006.01) | |
| G01R 31/36 | (2006.01) | |
| H02J 7/34 | (2006.01) | |

(52) U.S. Cl.
CPC .......... *H02J 7/0021* (2013.01); *G01R 31/362* (2013.01); *G01R 31/3658* (2013.01); *H02J 7/345* (2013.01)

(58) Field of Classification Search
CPC .................................................. H02J 7/0021

USPC ........................................................ 324/426
See application file for complete search history.

(56) References Cited

U.S. PATENT DOCUMENTS

| | | | | |
|---|---|---|---|---|
| 8,054,044 B2 * | 11/2011 | Kang | ............... | H02J 7/0016 320/118 |
| 2007/0029967 A1 * | 2/2007 | Morimoto | ............ | G01R 31/362 320/116 |

FOREIGN PATENT DOCUMENTS

| | | |
|---|---|---|
| JP | 2003-114243 A | 4/2003 |
| JP | 2009-092465 A | 4/2009 |
| JP | 2014-020914 A | 2/2014 |

\* cited by examiner

*Primary Examiner* — Edward Tso
*Assistant Examiner* — Ahmed Omar
(74) *Attorney, Agent, or Firm* — Oliff PLC (57) ABSTRACT

A flying capacitor type voltage detecting device which uses a capacitor to detect a voltage of each battery stack of a battery pack which includes a plurality of battery stacks each of which includes a plurality of battery cells connected in series, includes: a detecting unit that detects a voltage between both ends of the capacitor, as the voltage of each battery stack; and a branch line that is a single line which is branched from a connection line connecting the battery stacks and the detecting unit and connected to the capacitor and where a current during charging of the capacitor and a current during discharging of the capacitor flow in opposite directions.

6 Claims, 7 Drawing Sheets

VOLTAGE DETECTING DEVICE, VOLTAGE DETECTING METHOD, AND BATTERY PACK SYSTEM

CROSS-REFERENCE TO RELATED APPLICATIONS

This application is based on and claims priority under 35 USC 119 from. Japanese Patent Application No. 2015-039206 filed on Feb. 27, 2015, the entire content of which is incorporated herein by reference.

BACKGROUND

1. Technical Field

The present invention relates to a voltage detecting device, a voltage detecting method, and a battery pack system.

2. Related Art

In the related art, a battery pack having battery stacks connected in series is used as a power source for a vehicle such as an electric vehicle or a hybrid electric vehicle. Each of the battery stacks has a plurality of battery cells connected in series. As a device for detecting the voltage of each battery stack of a battery pack, a device using a flying capacitor is known.

In the device according to the related art, diodes are disposed on two lines such that current flow directions become opposite to each other, and the two lines are connected to a capacitor such that the capacitor is charged through one of the lines and is discharged through the other line (see Japanese Patent Application Laid-Open No. 2014-20914 for instance).

SUMMARY OF INVENTION

However, the device according to the related art needs circuit elements for restricting the current directions of the two lines, resulting in an increase in the number of circuit components. If the number of circuit components increases, the size and manufacturing cost of the circuit increase.

At least one embodiment of the present invention is to provide a voltage detecting device, a voltage detecting method, and a battery pack system capable of suppressing an increase in the number of circuit components.

At least one embodiment of the present invention provides a flying capacitor type voltage detecting device which uses a capacitor to detect a voltage of each battery stack of a battery pack which includes a plurality of battery stacks each of which includes a plurality of battery cells connected in series, including: a detecting unit that detects a voltage between both ends of the capacitor, as the voltage of each battery stack; and a branch line that is a single line which is branched from a connection line connecting the battery stacks and the detecting unit and connected to the capacitor and where a current during charging of the capacitor and a current during discharging of the capacitor flow in opposite directions.

According to the at least one embodiment of the present invention, it is possible to suppress an increase in the number of circuit components.

DESCRIPTION OF EMBODIMENTS

Hereinafter, embodiments of a voltage detecting device, a voltage detecting method, and a battery pack system according to the present invention will be described in detail with reference to the accompanying drawings. However, the present invention is not limited to the embodiments to be shown below.

First Embodiment

<Configuration of Battery Pack System>

Figure 1:
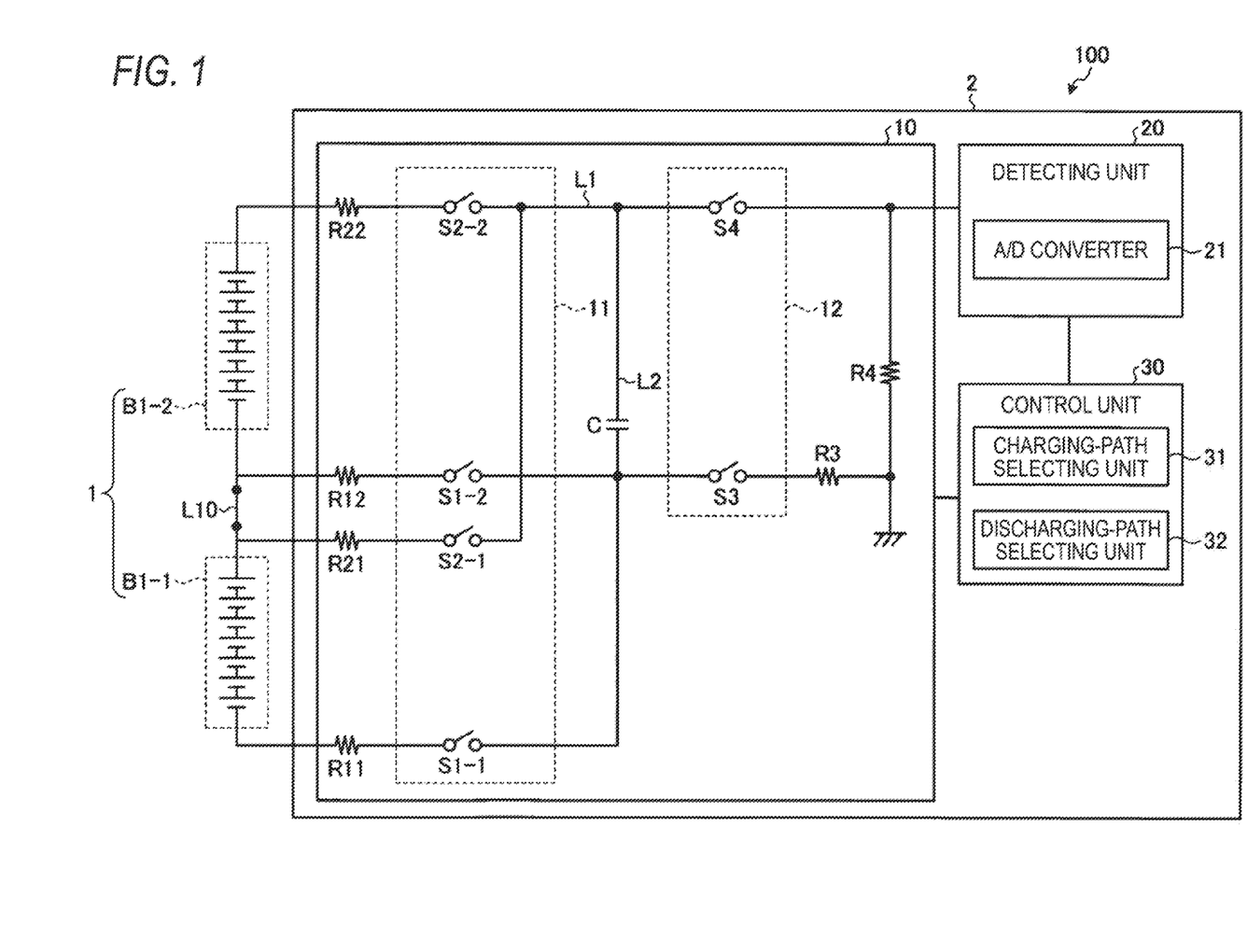
FIG. 1 is a view illustrating the configuration of a battery pack system according to a first embodiment.

FIG. 1 is a view illustrating an example of the configuration of a battery pack system 100 according to a first embodiment. The battery pack system 100 shown in FIG. 1 includes a battery pack 1 and a voltage detecting device 2.

The battery pack 1 includes a plurality of battery stacks B1-$n$ (wherein is a number between 1 and N which is a natural number, and which will also be referred to as the battery stacks B1) connected in series through connection members L1-$m$ (wherein "m" is a number between 1 and N−1 wherein "N" is a natural number, and which will also be referred to as the connection members L10). Each of the plurality of battery stacks B1-$n$ includes a plurality of battery cells connected in series. In the example of FIG. 1, two battery stacks B1-1 and B1-2 each include seven battery cells connected in series, and are connected through a connection member L10.

The voltage detecting device 2 is a device for detecting the voltages of the battery stacks B1 by a flying capacitor system using a capacitor C, and includes a flying capacitor unit 10, a detecting unit 20, and a control unit 30.

The flying capacitor unit 10 includes the capacitor C, a first switching unit 11 which is provided between the capacitor C and the battery stacks B1, and a second switching, unit 12 which is provided between the capacitor C and the detecting unit 20. Also, the flying capacitor unit 10 includes a connection line L1 which connects the first switching unit 11 and the second switching unit 12. Further, the flying capacitor unit 10 includes a branch line L2 which is branched from the connection line L1 and is connected to the capacitor C and where a current during charging of the capacitor C flows in a charging direction and a current during discharging of the capacitor flows in a discharging direction opposite to the charging, direction.

Furthermore, the flying capacitor unit 10 includes resistors R11, R12, R21, and R22 which are provided between the battery stacks B1 and the capacitor C and are connected with the first switching unit 11 in series, and resistors R3 and R4 which are provided between the second switching unit 12 and the detecting unit 20. The positions of the resistors R3 and R4 on lines shown in FIG. 1 are examples, and the resistors R3 and R4 may be provided at any other positions on lines positioned in the subsequent stage of the second switching unit 12. Also, the number of resistors which are installed may be changed.

The first switching unit 11 includes plurality first switches S1-1 and S1-2 (hereinafter, also referred to as the first switches S1) and a plurality of second switches S2-1 and S2-2 (hereinafter, also referred to as the second switches S2). One end of each of the first switches is connected to the negative terminal of a corresponding one of the battery stacks B1, and the other ends of the first switches are connected to one end of the capacitor C. Also, one end of each of the second switches is connected to the positive terminal of a corresponding one of the battery stacks B1, and the other ends of the second switches are connected to the other end of the capacitor C. The first switching unit 11 turns on or off the first switches S1 and the second switches S2 in response to instructions from the control unit 30. As described above, the first switching unit 11 operates as a first switching unit for switching the connection states between the battery stacks B1 and the capacitor C.

The second switching unit 12 includes a third switch S3 and a fourth switch S4. One end of the third switch is connected to one end of the capacitor C, and the other end thereof is connected to the detecting unit 20. Also, one end of the fourth switch is connected to one end of the capacitor C, and the other end thereof is connected to the detecting unit 20. The second switching unit 12 turns on or off the third switch S3 and the fourth switch S4 in response to instructions from the control unit 30. As described above, the second switching unit 12 operates as a second switching unit for switching the connection state between the capacitor C and the detecting unit 20. Also, as the first to fourth switches S1 to S4 described above, for example, relays may be used.

In a state where the capacitor C is disconnected from the detecting unit 20 by the second switching unit 12, the capacitor is connected to any one of the battery stacks B1-1 and B1-2, in parallel, through the first switching unit 11. As a result, the capacitor C is charged by the battery stack B1 connected thereto in parallel. Also, in a state where the capacitor C is disconnected from the battery stack B1, the capacitor is connected to the detecting unit 20 through the second switching unit 12. As a result, the detecting unit 20 detects the voltage between the capacitor C, as the voltage of the battery stack B1. In this way, the voltage detecting device 2 detects the voltage of each battery stack B1 by the flying capacitor system using the capacitor C. Also, a differential amplifier circuit may be provided between the second switching unit 12 and the detecting unit 20 such that the detecting unit 20 detects the voltage of the capacitor C on the basis of the output of the differential amplifier circuit.

The resistors R11 and R12 are provided between the first switches S1 and the battery stacks B1-1 and B1-2, and are connected to the first switches S1 in series. Also, the resistors R21 and R22 are provided between the second switches S2 and the battery stacks B1-1 and 61-2, and are connected to the second switches S2 in series. The resistors R11, R12, R21, and R22 operate as current restricting resistors for restricting currents flowing from the battery stacks B1 to the flying capacitor unit 10. Also, in FIG. 1, the resistors R11, R12, R21, and R22 are provided between the battery stacks B1 and the first switching unit. However, they may be provided, for example, between the first switching unit 11 and the capacitor C.

One end of the resistor R3 is connected to the third switch S3, and the other end thereof is connected to the detecting unit 20 while being connected to a ground. One end of the resistor R4 is connected to the fourth switch S4 while being connected to the detecting unit 20, and the other end thereof is connected to the ground. The resistors R3 and R4 operate as current restricting resistors for restricting a current flowing from the capacitor C to the detecting unit 20. Also, in the present embodiment, since the resistors R3 and R4 are connected to the capacitor C through the second switching unit 12, they also operate as discharging resistors for discharging the electric charge of the capacitor C.

The detecting unit 20 detects the voltage between both ends of the capacitor C, as the voltage of a battery stack B1. Specifically, the detecting unit 20 includes an A/D converter 21, and converts the analog value of the voltage between both ends of the capacitor C into a digital value by the A/D converter 21, and outputs the digital value to the control unit 30.

The control unit 30 controls the first switching unit 1 and the second switching unit 12. The control unit 30 includes a charging-path selecting unit 31 and a discharging-path selecting unit 32. In a case of charging the capacitor C, the charging-path selecting unit 31 selects a charging path P1 including a battery stack B1 to be subjected to voltage detection, the capacitor C, and the branch line L2. In a case of discharging the capacitor C, the discharging-path selecting unit 32 selects a discharging path P2 including the capacitor C and the branch line L2. The details of charging paths P1 and the discharging path P2 will be described with reference to FIGS. 2 and 3.

The control unit 30 controls the first switching unit 11 and the second switching unit 12, such that, during charging of the capacitor C, a charging path P1 is selected, and during discharging of the capacitor, the discharging path P2 is selected. Also, in a case of detecting the voltage of the capacitor C, the control unit 30 controls the first switching unit 11 and the second switching unit 12, such that the capacitor C is disconnected from the battery stacks B1 and the capacitor C is connected to the detecting unit 20. Also, the control unit 30 monitors the charged state of each battery stack B1 on the basis of the voltage of the corresponding battery stack B1 detected by the detecting unit 20.

<Selection of Charging Path P1>

Figure 2:
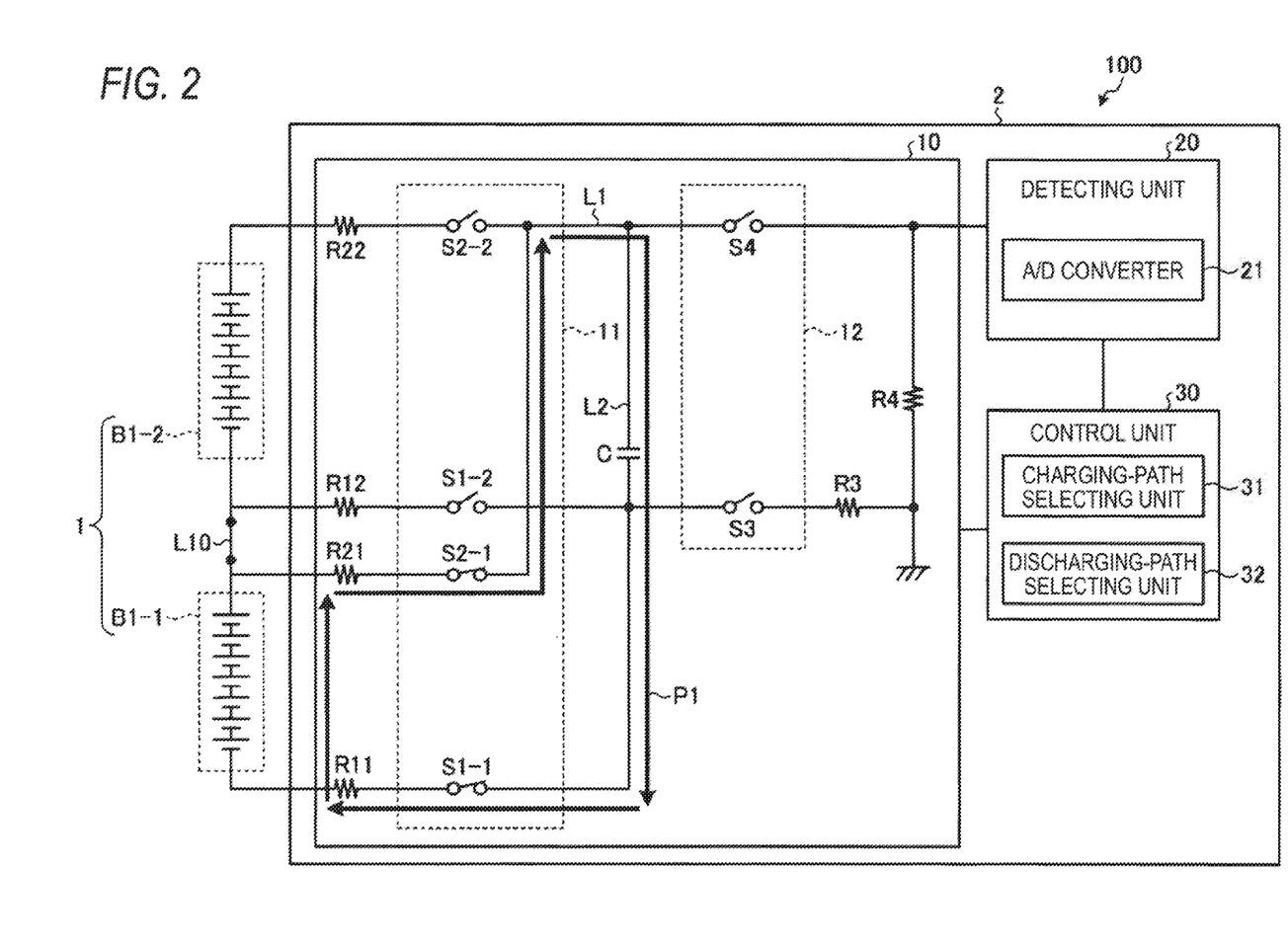
FIG. 2 is a view illustrating an example of a charging path which is selected by a charging-path selecting unit.

Now, the details of a charging path P1 which is selected by the charging-path selecting unit 31 of the control unit 30 will be described with reference to FIG. 2. FIG. 2 is a view illustrating an example of the charging path P1 which is selected by the charging-path selecting unit 31. In FIG. 2, there is shown a case of detecting the voltage of the battery stack B1-1.

First, if the control unit 30 instructs the charging-path selecting unit 31 to select a charging path P1 for the battery stack B1-1, the charging-path selecting unit selects a charging path P1 including the battery stack B1-1 and the capacitor C connected in parallel.

Specifically, the charging-path selecting unit 31 selects a charging path P1 including the battery stack B1-1, the resistors R11 and R21, the first switch S1-1, the second switch S2-1, the capacitor C, and the branch line L2 as shown in FIG. 2.

In other words, the control unit 30 controls the first and second switching units 11 and 12 such that a closed circuit having the charging path P1 is formed in the flying capacitor unit 10. Specifically, the control unit 30 performs control, such that the first and second switches S1-1 and S2-1 connected to the battery stack B1-1 are turned on and the other switches S1-2, S2-2, S3, and S4 are turned off.

As a result, in the flying capacitor unit 10, a current flows in a direction shown by arrows of FIG. 2, whereby the capacitor C is charged. The direction of a current which flows in the branch line L2 as described above in a case of charging the capacitor C will be referred to as the "charging direction".

Although a case where the control unit 30 determines the battery stack B1-1 as a subject of voltage detection has been described above, the charging-path selecting unit 31 may determine a battery stack B1 to be a detection subject.

<Selection of Discharging Path P2>

Figure 3:
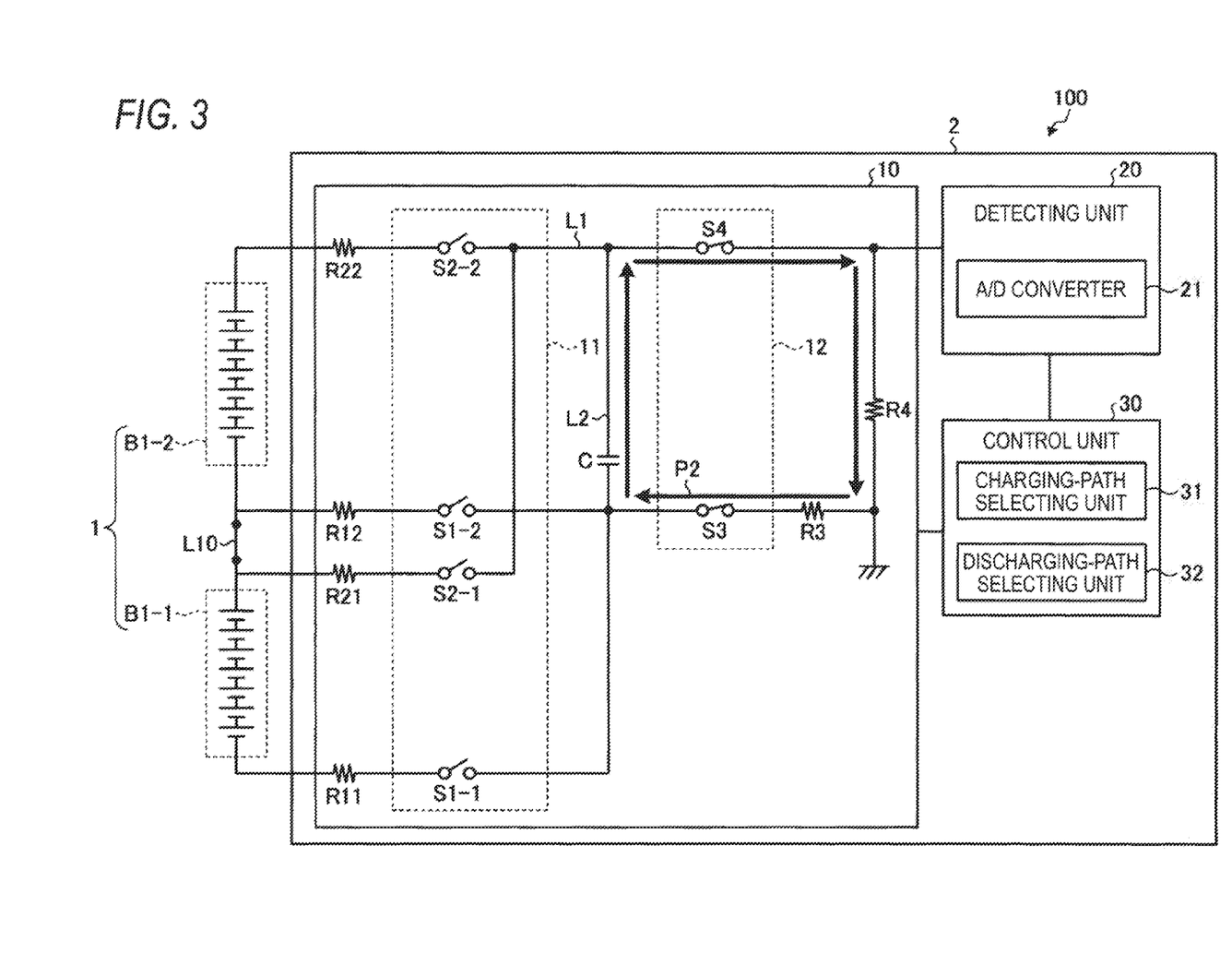
FIG. 3 is a view illustrating an example of a discharging path which is selected by discharging-path selecting unit.

Now, the details of the discharging path P2 which is selected by the discharging-path selecting unit 32 of the control unit 30 will be described with reference to FIG. 3. FIG. 3 is a view illustrating an example of the discharging path P2 which is selected by the discharging-path selecting unit 32.

If the control unit 30 instructs the discharging-path selecting unit 32 to select the discharging path P2, the discharging-path selecting unit selects the discharging path P2 including the resistors R3 and R4 and the capacitor C connected. Specifically, the discharging-path selecting unit 32 selects the discharging path P2 including the capacitor C, the third and fourth switches S3 and S4, the resistors R3 and R4, and the branch line L2.

In other words, the control unit 30 controls the first and second switching units 11 and 12 such that a closed circuit having the discharging path P2 is formed in the flying capacitor unit 10. Specifically, the control unit 30 performs control, such that the first and second switches S1 and S2 are turned off and the third and fourth switches S3 and S4 are turned on.

As a result, in the flying capacitor unit 10, a current flows in the direction shown by arrows of FIG. 3, whereby the capacitor C is discharged. The direction of a current which flows in the branch line L2 as described above in a case of discharging the capacitor C will be referred to as the "discharging direction". The discharging direction is opposite to the charging direction described above. As described above, the current which flows in the charging direction and the current which flows in the discharging direction flow in the branch line L2 which is a single line. Like this, a part of the charging circuit and a part of the discharging circuit are formed by one line.

In the present embodiment, the charging-path selecting unit 31 and the discharging-path selecting unit 32 select a charging path P1 and the discharging path P2 each of which includes the branch line L2, respectively. For this reason, It becomes unnecessary to separately provide each charging line for accumulating electric charge in the capacitor C during charging, and the discharging line for releasing electric charge during discharging, as lines to be connected to the capacitor C. Therefore, it becomes unnecessary to provide circuit elements, such as diodes, for restricting the directions of currents flowing in each charging line and the discharging line. Therefore, it is possible to suppress an increase in the number of components of the voltage detecting device 2.

<Description of Voltage Detecting Process>

Figure 4:
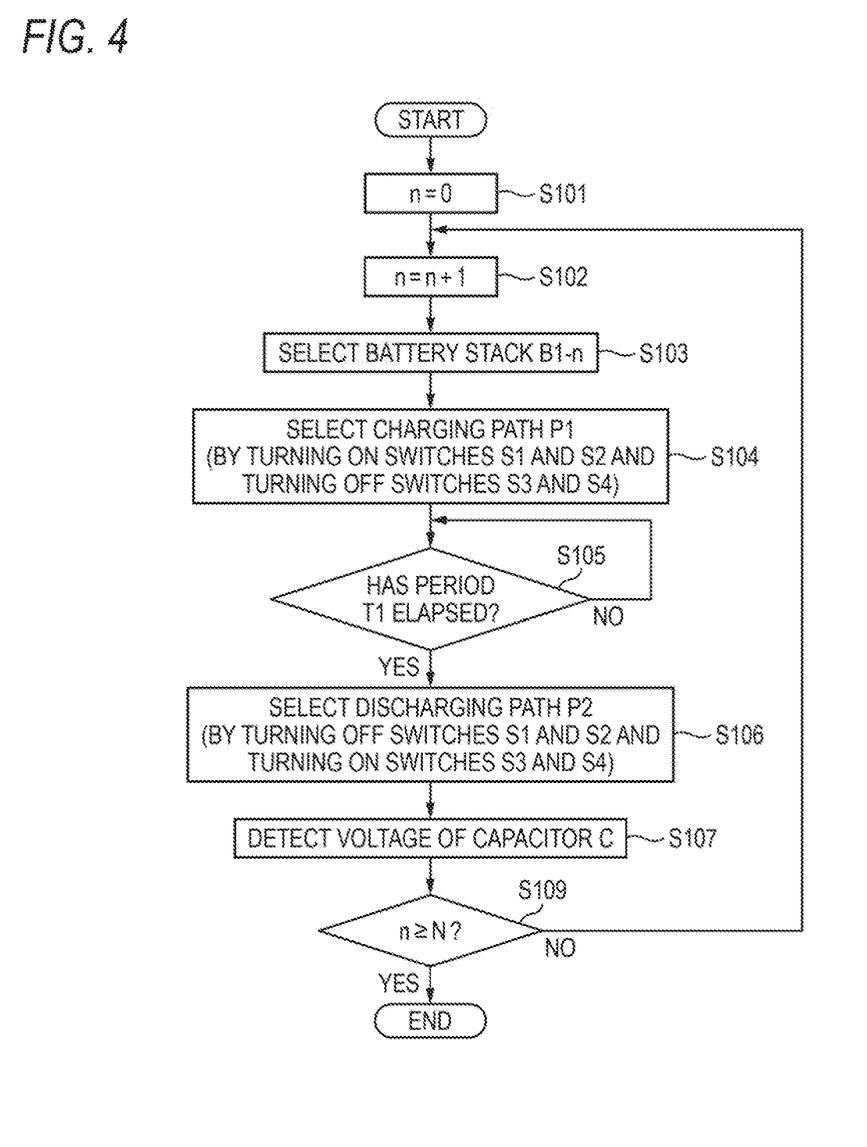
FIG. 4 is a flow chart illustrating an example of the process procedure of a voltage detecting process.

Now, a voltage detecting process which is performed by the control unit 30 will be described with reference to FIG. 4, FIG. 4 is a flow chart illustrating an example of the process procedure of the voltage detecting process.

First, in STEP S101, the control unit 30 initializes a stack designation variable "n" to 0. Subsequently, in STEP S102, the control unit increases the stack designation variable "n" by 1. Then, in STEP S103, the control unit 30 selects the n-th battery stack B1-n as a battery stack B1 to be subjected to voltage detection. At this time, since the stack designation variable "n" is 1, the control unit 30 selects the battery stack B1-1.

Subsequently, in STEP S104, the control unit 30 selects a charging path P1 including the battery stack B1-1. In other words, the control unit 30 controls the first and second switching units 11 and 12 such that a closed circuit having the charging path P1 is formed in the flying capacitor unit 10. Specifically, the control unit 30 performs control, such that a first switch S1 and a second switch S2 included in the first switching unit 11 are turned on and the third and fourth switches S3 and S4 are turned off. As a result, the capacitor C is charged with the voltage of the battery stack B1-1.

After controlling the first and second switching units 11 and 12, the control unit 30 stands by in STEP S105 until a period T1 required for charging of the capacitor C to be completed elapses. After the period T1 elapses, in STEP S106, the control unit controls the first and second switching units 11 and 12, such that the closed circuit having the discharging path P2 is formed for detecting the voltage of the capacitor C as the voltage of the battery stack B1-1. Specifically, the control unit 30 performs control, such that the first and second switches S1 and S2 of the first switching unit 11 are turned off and the third and fourth switches 83 and 84 of the second switching unit 12 are turned on. As a result, the detecting unit 20 is connected to the capacitor C. In STEP S107, the detecting unit detects the voltage between both ends of the capacitor C at the moment of the connection of the detecting unit with the capacitor. At the same time as the detection, the capacitor C is discharged through the discharging path P2.

Subsequently, in STEP S109, the control unit 30 determines whether the voltages of all battery stacks B1 have been detected. Specifically, in a case where the stack designation variable "n" is equal to or larger than N which is the number of battery stacks B1 ("Yes" in STEP S109), the control unit 30 determines that the voltages of all battery stacks B1 have been detected, and finishes the voltage detecting process.

Meanwhile, in a case where the stack designation variable "n" is smaller than N which is the number of battery stacks B1 ("No" in STEP S109), the control unit 30 returns to STEP S102 if a period T2 required for the voltage of the capacitor C to be 0 V elapses after STEP S107.

Also, the period T1 or T2 is determined in view of the time of the transient response which is performed until the capacitor C becomes a normal state, and the period T1 is determined by a time constant according to the capacitance value of the capacitor C and the resistance values of the resistors R11 and R21 or the resistors R12 and R21 in the closed circuit of each charging path P1, and the period T2 is determined by a time constant according to the capacitance value of the capacitor C and the resistance values of the resistors R3, and R4 in the closed circuit of the discharging path P2.

Also, in the voltage detecting process described above, the voltages of the battery stacks are sequentially detected from the battery stack B1-1 having a low voltage potential. However, the present invention is not limited thereto. The voltages of the battery stacks may be sequentially detected from the battery stack B1-N having a high voltage potential, or may be detected in a random order.

Also, the voltage detection order may be stored, for example, in a storage unit (not shown) which is included in the voltage detecting device 2. In this case, the storage unit may store an order in which the battery stacks B1 will be selected, or may store an order in which the first and second switches S1 and S2 will be turned on. The control unit 30 may read the order of the battery stacks B1 or the order of the first and second switches S1 and S2 stored in the storage unit, thereby selecting a battery stack B1 to be subjected to voltage detection, or a charging path P1.

<Example of Application to Charging/Discharging System>

Figure 5:
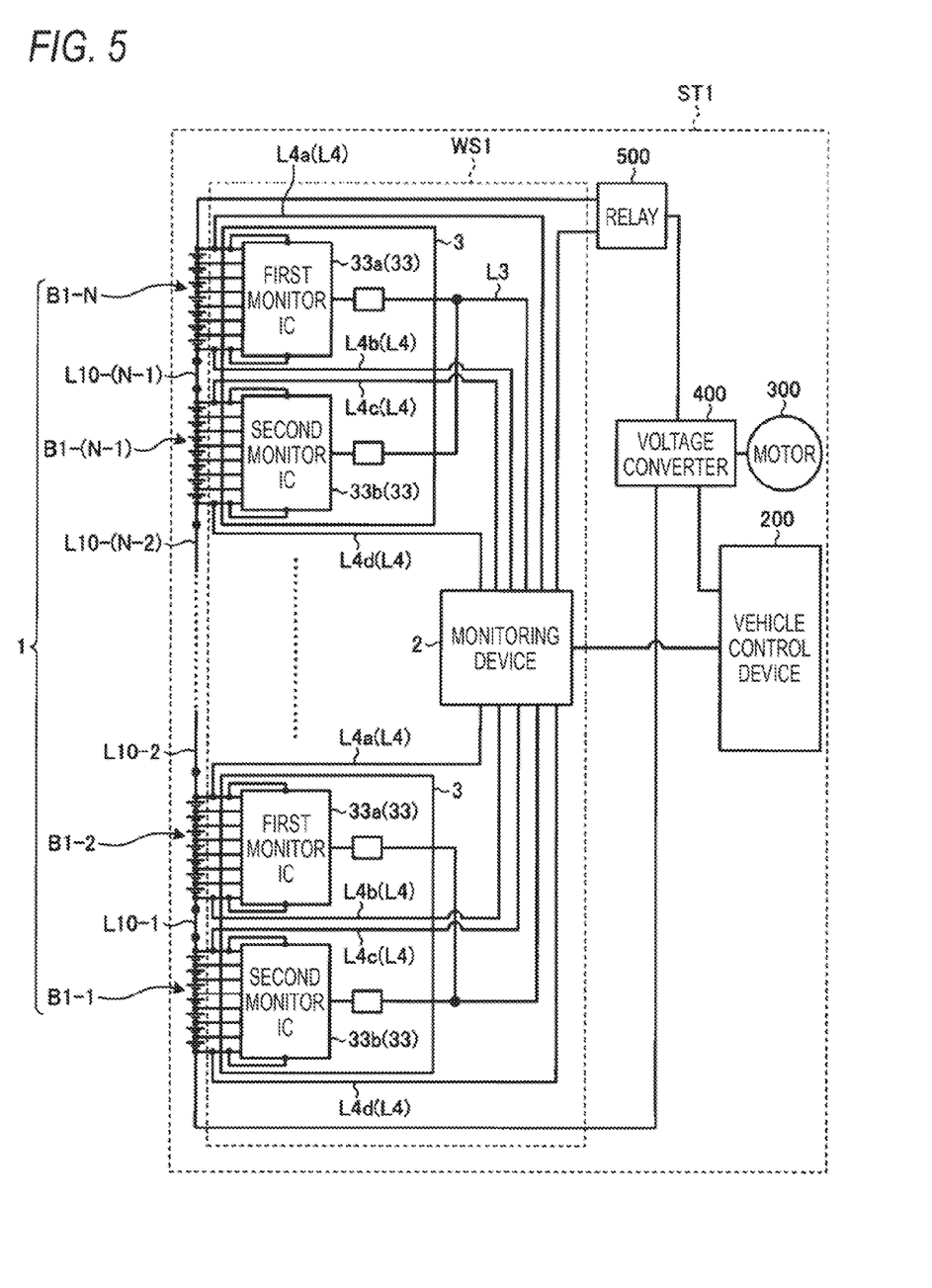
FIG. 5 is a view illustrating the outline of a charging/discharging system.

Now, a case of applying the battery pack system 100 shown in FIG. 1 to a charging/discharging system ST1 will be described with reference to FIG. 5. FIG. 5 is a view illustrating the outline of the charging/discharging system ST1. The charging/discharging system ST1 shown in FIG. 5 is usable as a power source for driving a vehicle such as a hybrid electric vehicle (HEV), an electric vehicle (EV) or a fuel cell vehicle (FCV).

The charging/discharging system ST1 is a system including a battery pack 1, a battery monitoring system WS1, a vehicle control device 200, a motor 300, a voltage converter 400, and a relay 500. Also, the battery monitoring system WS1 includes a plurality of satellite boards 3 having monitor ICs 33 and so on and a voltage detecting device 2 (hereinafter, also referred to as the monitoring device 2) which operates as a monitoring device. Also, the battery pack 1 and the monitoring device 2 which are included in the charging/discharging system ST1 correspond to the battery pack system 100 shown in FIG. 1.

The battery pack 1 of FIG. 5 is a battery which is insulated from the body of a vehicle, and is configured by a plurality of blocks. In each block, sixteen battery cells are connected in series. The sixteen battery cells of each block are connected to monitor ICs 33 installed on one corresponding satellite board 3. Therefore, the voltages of the individual battery cells of each block can be measured by monitor ICs 33 installed in a corresponding satellite board 3.

Also, each satellite board 3 has two monitor ICs, that is, a first monitor IC 33a and a second monitor IC 33b installed thereon, such that the first monitor IC 31a and the second monitor IC 31b take charge of two battery cell groups of a corresponding block, respectively. Also, each battery cell group is configured by eight cells corresponds to a battery stack B1 of FIG. 1. Also, each connection member L10-m electrically connects two neighboring battery stacks B1 of the plurality of battery stacks B1-n.

The monitoring device 2 monitors the voltage of each battery stack B1 while monitoring the voltage of each of the plurality of battery cells. In other words, the monitoring device 2 monitors the charged state of the battery pack 1. Specifically, the monitor ICs 33 measure the individual voltages of the battery cells (hereinafter, also referred to as the cell voltages), on the basis of voltage measurement requests received from the monitoring device 2 through communication lines L3, and transmit the measurement results to the monitoring device 2 through the communication lines L3.

The monitoring device 2 receives cell voltages from each monitor IC 33 and charges the capacitor C (see FIG. 1) with the voltage of a corresponding battery stack B1 (hereinafter, referred to as the "stack voltage") through a communication line L4, thereby directly measuring the stack voltage. In this way, the monitoring device monitors the charged state. As described above, the monitoring device 2 operates as a voltage detecting device for detecting the stack voltages, and also operates as a monitoring device for monitoring the charged state of the battery pack 1.

The monitoring device 2 also operates as a determining device for determining whether each monitor IC 33 operates normally. For example, the monitoring device 2 adds the individual voltages of the battery cells received from each monitor IC 33, and compares the sum with a directly detected stack voltage. In a case where the difference between them is larger than an allowable value, the monitoring device 2 determines that the corresponding monitor IC 33 is abnormal. In a case of determining that a monitor IC 33 is abnormal, the monitoring device 2 performs a fail-safe function. For example, the monitoring device 2 performs the fail-safe function such that the relay 500 is disconnected from the corresponding monitor IC, whereby charging and discharging on the corresponding battery cells are not performed.

The vehicle control device 200 performs charging and discharging on the battery pack 1 in response to the charged state of the battery pack 1. Specifically, in a case where the battery pack 1 is in an over-charge state, the vehicle control device 200 converts the DC voltage of the charged battery pack 1 into an AC voltage by the voltage converter 400, and drives the motor 300. As a result, the battery pack 1 is discharged.

Also, in a case where the battery pack 1 is in an over-discharge state, the vehicle control device 200 converts the AC voltage generated by regenerative braking of the motor 300, into a DC voltage, by the voltage converter 400. As a result, the battery pack 1 is charged with the voltage. As described above, the vehicle control device 200 monitors the voltage of the battery pack 1 on the basis of the charged state of the battery pack 1 acquired from the monitoring device 2, and performs control according to the monitoring result.

As described above, the voltage detecting device 2 according to the first embodiment selects a path including the branch line L2, as a charging path P1 or the discharging path P2. For this reason, it becomes unnecessary to separately provide, a charging line for accumulating electric charge in the capacitor C during charging, and a discharging line for releasing electric charge during discharging. Therefore, it is possible to omit circuit elements, such as diodes, for restricting the directions of currents flowing in each charging line and the discharging line. Therefore, it is possible to reduce the number of components of the voltage detecting device 2, and it is possible to suppress an increase in the number of components of the battery pack system 100 including the voltage detecting device 2.

Also, if the voltage detecting device 2 according to the first embodiment is applied to the charging/discharging system ST1 usable as a power source for driving a vehicle such as a hybrid electric vehicle, it is possible to suppress an increase in the number of components of the charging/discharging system ST1.

Second Embodiment

In the first embodiment, a case where the discharging-path selecting unit 32 selects the discharging path P2 to release the electric charge of the capacitor C has been described. In that case, as the resistance values of the resistors R3 and R4 provided on the line of the discharging path P2 increase, the length of the transient response of an RC circuit configured by the capacitor C and the resistors R increases. In other words, a discharge time constant increases. In a case of detecting the voltage between both ends of the capacitor C, since it is necessary to turn on the switches S3 and S4, and perform A/D conversion on the voltage of the capacitor C at the moment of formation of the discharging path, and measure the DC voltage, if the time constant is small, since a decrease in the voltage of the capacitor C at the time of the A/D conversion becomes large, it becomes impossible for the detecting unit 20 to measure the accurate voltage of each stack. In contrast, in a case where the resistance values of the resistors R3 and R4 are relatively large, that is, in a case where the discharge time constant is large, since a decrease in the voltage of the capacitor C at the time of the A/D conversion becomes small, it is possible to detect the accurate voltage of the capacitor C immediately after start of discharging.

However, in the case where the resistance values of the resistors R3 and R4 are relatively large, a considerable amount of time is required for discharging of the capacitor C to be completed. For this reason, after discharging along the discharging path P2 starts and the detecting unit 20 detects the voltage of the battery stack B1-1, if discharging along the discharging path P2 continues, a considerable amount of time is required to detect the voltage of another battery stack B1-2. As a result, a relatively large amount of time is required to detect the voltages of the plurality of battery stacks.

Figure 6:
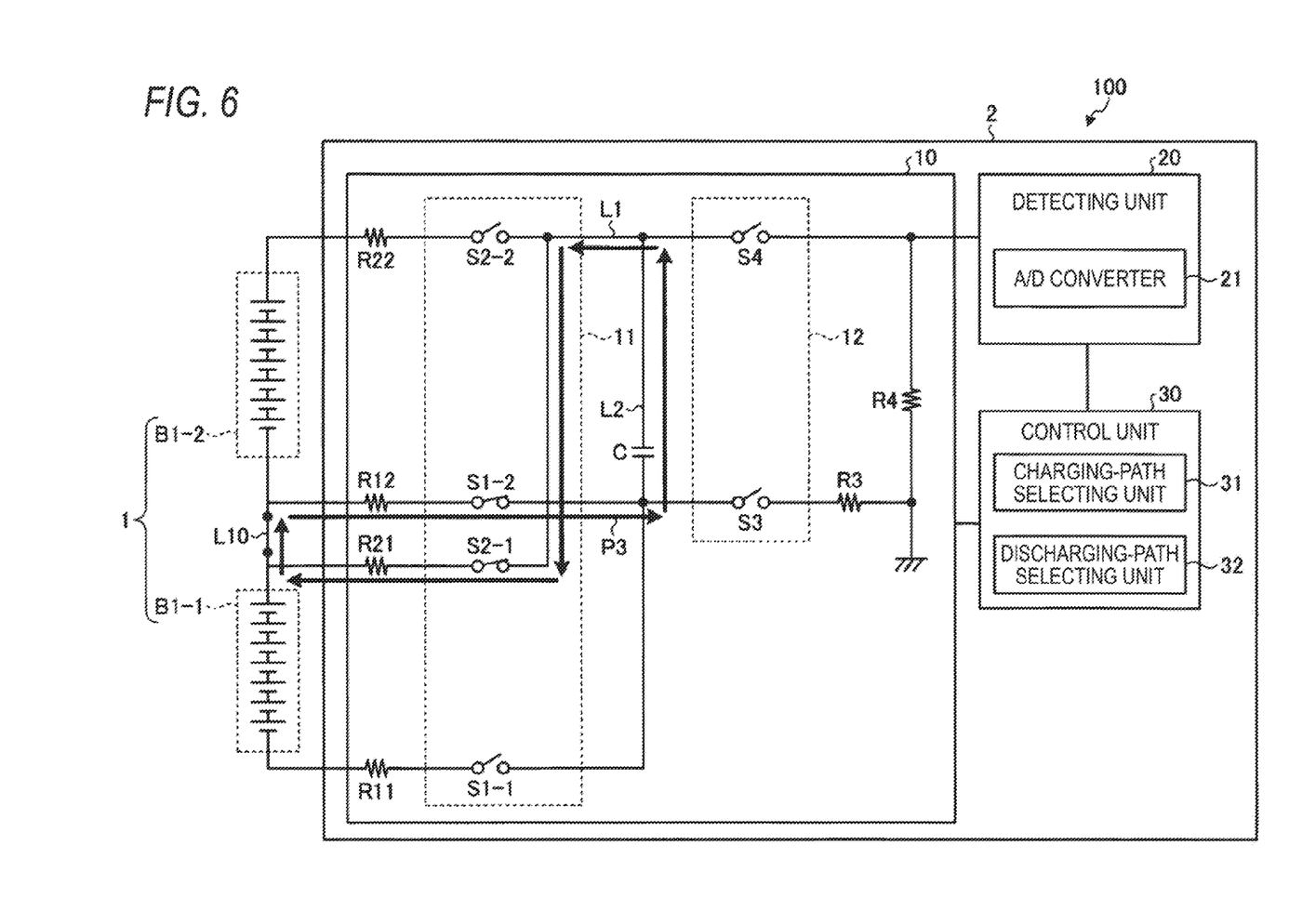
FIG. 6 is a view illustrating an example of a discharging path according to a second embodiment.

For this reason, in the second embodiment, after the detecting unit 20 detects the voltage of a battery stack B1 by the discharging path P2, the discharging-path selecting unit 32 of the voltage detecting device 2 performs switching to a discharging path P3 which is a path having a smaller discharge time constant and including a connection member L10 connecting two neighboring battery stacks B1 of the plurality of battery stacks B1. In other words, after the A/D converter 21 detects the voltage of a battery stack B1, the discharging-path selecting unit 32 switches the discharging path from the discharging path P2 having a large discharge time constant to the discharging path P3 having a small discharge time constant.

As a result, it is possible to detect the accurate voltage of each battery stack B1 used to charge the capacitor C while suppressing an increase in the circuit size of the voltage detecting device 2, and it is possible to reduce the discharging time of the capacitor C. This will be described below in detail with reference to FIG. 6.

FIG. 6 is a view illustrating an example of a discharging path P3 according to the second embodiment. If the detecting unit 20 completes detection of the voltage of a battery stack B1 by the discharging path P2, the control unit 30 instructs the discharging-path selecting unit 32 to perform switching from the discharging path P2 to a discharging path P3, and the discharging-path selecting unit selects a discharging path P3 including a connection member L10 and the capacitor C. Specifically, the discharging-path selecting unit 32 selects a discharging path P3 including the capacitor C, the resistors R12 and R21, the first switch S1-2, the second switch S2-1, and the branch line L2.

In other words, the control unit 30 controls the first and second switching units 11 and 12 such that the closed circuit of the discharging path P3 is formed in the battery pack system 100. Specifically, the control unit 30 performs control, such that the first switch S1-1 connected to the battery stack B1-1 and the second switch S2-2 connected to the battery stack B1-2 are turned off, and the first switch S1-2 and the second switch S2-1 connected to the connection member L10 are turned on. Also, the control unit 30 performs control such that the third and fourth switches S3 and S4 are turned off. Also, the resistance values of the resistors R12 and R21 which are included in the discharging path P3 are smaller than the resistance values of the resistors R3 and R4 which are included in the discharging path P2. In other words, the second discharge time constant of the discharging path P3 is smaller than the first discharge time constant of the discharging path P2.

As described above, the discharging-path selecting unit 32 operates as a selecting unit for selecting any one of the discharging path P2 which has the first discharge time constant and where a discharge current from the capacitor C will flow, and the discharging path P3 which has the second discharge time constant smaller than the first discharge time constant and where a discharge current from the capacitor C will flow. Alternatively, for example, the control unit 30 may be configured to further include a selecting unit separately from the discharging-path selecting unit 32.

If the discharging-path selecting unit 32 performs switching from the discharging path P2 to the discharging path P3, it is possible to detect the accurate voltage of the battery stack B1 used to charge the capacitor C while suppressing an increase in the circuit size, and it is possible to reduce the discharging time of the capacitor C. Hereinafter, the reason will be described.

In general, the resistance values of the resistors R12 and R21 are smaller than those of the resistors R3 and R4 positioned on the detecting unit (20) side. One of the reasons is that, in order to reduce the charging time, it is preferable to reduce the charge time constant, that is, to reduce the resistance values of the resistors R11 to R22, and in order to accurately measure each stack voltage, it is preferable to increase the discharge time constant, that is, to increase the resistance values of the resistors R3 and R4. For example, the resistance values of the resistors R3 and R4 are several kΩ, and the resistance values of the resistors R1 and R2 are several hundreds Ω.

For this reason, in the present embodiment, after the detecting unit 20 completes detection of the voltage of a battery stack B1 by the discharging path P2, the discharging-path selecting unit 32 switches the discharging path from the discharging path P2 to the discharging path P3 including the connection member L10, such that the resistor R12 connected to the first switch S1-2 in series and the resistor R21 connected to the second switch S2-1 in series become discharging resistors. In this way, it is possible to set the values of the resistors which are included in the discharging path P3 and are smaller than those in the case of performing discharging by the discharging path P2 having the resistors R3 and R4 as discharging resistors, that is, it is possible to reduce the discharge time constant, and it is possible to reduce the length of the transient response of the circuit of the discharging path P3, that is, the discharging time of the capacitor C.

Also, since the resistors R12 and R21 become discharging resistors, charging resistors which are used during charging can be used as discharging resistors. Therefore, it is unnecessary to add new resistors and it is possible to set the resistance value of the discharging path P3 smaller than the resistance value of the discharging path P2. Therefore, it is possible to reduce the discharging time of the capacitor C while suppressing an increase in the circuit size. Alternatively, as the discharging path having the second discharge time constant, a discharging path may be provided separately from the path including the connection member L10 as long as the corresponding path has a discharge time constant smaller than the first discharge time constant. Even in this case, it is possible to reduce the discharging time of the capacitor C.

Figure 7:
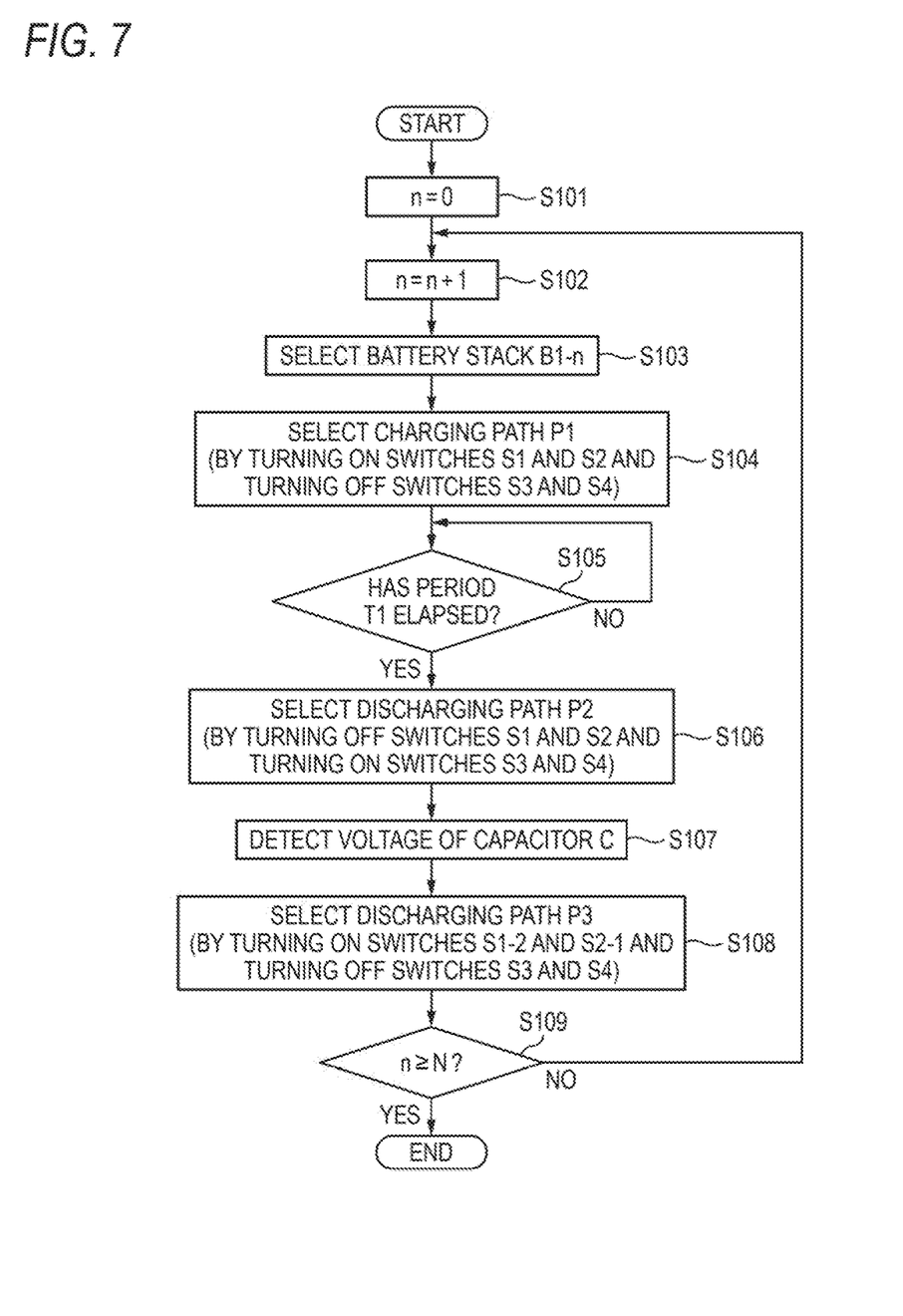
FIG. 7 is a flow chart illustrating an example of the process procedure of another voltage detecting process.

Now, a voltage detecting process which is performed by the control unit 30 according to the present embodiment will be described with reference to FIG. 7. The voltage detecting process which is performed by the control unit 30 is different from the voltage detecting process shown in FIG. 4 in that it further includes STEP S108 of FIG. 7. In other words, if the discharging path P2 having the large time constant is selected in STEP S106, and the voltage of a battery stack B1 is detected in STEP S107, in STEP S108, the control unit performs switching to the discharging path P3 having the small time constant. In other words, in STEP S107, the control unit 30 selects the discharging path P2 until the detecting unit 20 completes detection of the voltage of a battery stack B1. If the detecting unit 20 completes detection of the voltage of the corresponding battery stack B1, the control unit performs switching to the discharging path P3.

Also, although a case where there is one connection member LW is shown in FIG. 6, for example, even in a case where the number of connection members L10 is N−1 as shown in FIG. 5, it is possible to perform switching from the discharging path P2 to a discharging path P3 in the same way. In this case, for example, if the capacitor C is charged with a battery stack B1-$n$ (wherein "n" is a number between 1 and N−1), the discharging-path selecting unit 32 selects a discharging path P3 including a connection member L10-$m$ (wherein "m" is equal to "n") positioned between the battery stack B1-$n$ and the battery stack B1-$(n+1)$.

As described above, the discharging-path selecting unit selects the discharging path P3 including the connection member L10-$m$ (wherein "m" is equal to "n") connected to the battery stack B1-$n$ subjected to voltage detection. Therefore, it is possible to uniformize the numbers of times the first switches S1 and 82 of the first switching unit 11 are turned on or off. Therefore, only specific first and switches S1 and S2 of the first and second switches S1 and S2 included in the first switching unit 11 are prevented from exceeding the upper limits of the numbers of times of use of them, and thus it is possible to extend the lifetime of the first switching unit 11.

In a case where "n" is N, that is, in a case where the capacitor C is charged with the battery stack B1-N positioned at an end of the battery pack 1, for example, the discharging-path selecting unit 32 may select a discharging path P3 including the connection member L10-(N−1) provided between the battery stack B1-N and the battery stack B1-(N−1) adjacent thereto.

Alternatively, in a case where the control unit 30 performs the voltage detecting process, multiple times, whenever the voltage detecting process is performed, the discharging-path selecting unit 32 may select a discharging path P3 including a different connection member L10. In the case of charging the capacitor C with the battery stack B1-N positioned at an end of the battery pack 1 described above, whenever the voltage detecting process is performed, a different connection member L10 can be included in a discharging path P3, whereby it is possible to further uniformize the numbers of times the first switches S1 and S2 are turned on or off.

Also, the selection order of the discharging paths P3, that is the selection order of the connection members L10 to be included in the discharging paths P3 may be stored, for example, in the storage unit (not shown) which is included in the voltage detecting device 2. In this case, the storage unit may store an order in which the connection members L10 will be selected, or may store an order in which the first and second switches S1 and S2 will be turned on. The control unit 30 may read the order of the connection members L10 or the first and second switches S1 and S2 stored in the storage unit, whereby selecting a connection member L10 or a discharging path P3.

As described above, the voltage detecting device 2 according to the second embodiment is configured such that the discharging-path selecting unit 32 selects a discharging path P3 which is a path having a relatively small time constant and including a connection member L10 electrically connecting two neighboring battery stacks B1 of the plurality of battery stacks B1. Therefore, it is possible to reduce the discharging time of the capacitor C while suppressing an increase in the circuit size of the voltage detecting device 2. Therefore, it is possible to reduce the voltage detection time of the voltage detecting device 2.

Also, in the voltage detecting device 2 according to the second embodiment, the discharging-path selecting unit 32 selects the discharging path P2 having the large discharge time constant until the detecting unit 20 completes detection of the voltage of a battery stack B1. If the detecting unit 20 completes detection of the voltage of the corresponding battery stack B1, the discharging-path selecting unit 32 switches the discharging path to a discharging path P3 having a small discharge time constant. The discharging path P3 is a path including a connection member L10 electrically connecting two neighboring battery stacks B1 of the plurality of battery stacks B1. Therefore, it is possible to detect the accurate voltage of each battery stack B1 used to charge the capacitor C while suppressing an increase in the circuit size of the voltage detecting device 2, and it is possible to reduce the discharging time of the capacitor C. Therefore, it is possible to reduce the voltage detection time of the voltage detecting device 2.

Also, although the monitoring device 2 and the satellite boards 3 according to the present embodiment are separately provided, they may be integrally provided.

Also, in the present embodiment, a component including a plurality of battery cells has been described as a battery stack. However, a component including a plurality of battery cells can also be referred to as a batter block or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flying capacitor type voltage detecting device which uses a capacitor to detect a voltage of each battery stack of a battery pack which includes a plurality of battery stacks each of which includes a plurality of battery cells connected in series, comprising:
   a detecting unit that detects a voltage between both ends of the capacitor, as the voltage of each battery stack;
   a branch line that is a single line which is branched from a connection line connecting the battery stacks and the detecting unit and connected to the capacitor and where a current during charging of the capacitor and a current during discharging of the capacitor flow in opposite directions;
   a switching unit that is provided between the battery stacks and the capacitor; and
   a control unit that controls the switching unit,
   wherein the control unit includes:
      a charging-path selecting unit that selects a charging path including a battery stack to be subjected to voltage detection, the capacitor and the branch line, in a case of charging the capacitor, and
      a discharging-path selecting unit that selects a discharging path including a connection member electrically connecting two neighboring battery stacks of the plurality of battery stacks, the capacitor and the branch line in a case of discharging the capacitor.

2. The voltage detecting device according to claim 1, further comprising:
- a selecting unit that selects any one discharging path of a first discharging path which has a first discharge time constant and where a discharge current from the capacitor flows, and a second discharging path which has a second discharge time constant smaller than the first discharge time constant and where the discharge current from the capacitor flows,
- wherein, before detection of the voltage of the capacitor is completed, the selecting unit selects the first discharging path, and after the detection of the voltage of the capacitor is completed, the selecting unit performs switching to the second discharging path.

3. The voltage detecting device according to claim 2, wherein:
- the second discharging path is a discharging path including a connection member electrically connecting neighboring two battery stack of the plurality of battery stacks, the capacitor and the branch line.

4. The voltage detecting device according to claim 1, wherein:
- the switching unit includes
  - a plurality of first switches each of which has one end connected to a negative terminal of a corresponding one of the plurality of battery stacks and the other end connected to one end of the capacitor, and
  - a plurality of second switches each of which has one end connected to a positive terminal of a corresponding one of the plurality of battery stacks and the other end connected to the other end of the capacitor, and
- the charging-path selecting unit selects a path including a first switch and a second switch connected to the battery stack to be subjected to voltage detection, as the charging path, and
- after the voltage of the capacitor is detected, the discharging-path selecting unit selects a path including a first switch and a second switch connected to the connection member provided between the battery stack included in the charging path and another battery stack adjacent thereto, as the discharging path.

5. A flying capacitor type voltage detecting method which uses a capacitor to detect a voltage of each battery stack of a battery pack which includes a plurality of battery stacks each of which includes a plurality of battery cells connected in series, comprising:
- charging the capacitor by making a current flow in a charging direction in a branch line which is a single line branched from a connection line connecting a detecting unit and each battery stack and connected to the capacitor;
- detecting a voltage between both ends of the capacitor as the voltage of each battery stack by the detecting unit;
- discharging the capacitor by making a current flow in the branch line in a discharging direction opposite to the charging direction;
- controlling to select a charging path including a battery stack to be subjected to voltage detection, the capacitor and the branch line, in a case of charging the capacitor; and
- controlling to select a discharging path including a connection member electrically connecting two neighboring battery stacks of the plurality of battery stacks, the capacitor and the branch line in a case of discharging the capacitor.

6. A battery pack system comprising:
- a battery pack that includes a plurality of battery stacks each of which includes a plurality of battery cells connected in series; and
- a flying capacitor type voltage detecting device that detects voltages of the battery stacks by the capacitor,
- wherein the voltage detecting device includes
- a detecting unit that detects a voltage between both ends of the capacitor, as the voltage of each battery stack;
- a branch line that is a single line which is branched from a connection line connecting each battery stack and the detecting unit and connected to the capacitor and where a current during charging of the capacitor and a current during discharging of the capacitor flow in opposite directions; and
- a switching unit that is provided between the battery stacks and the capacitor; and
- a control unit that controls the switching unit,
- wherein the control unit includes:
  - a charging-path selecting unit that selects a charging path including a battery stack to be subjected to voltage detection, the capacitor and the branch line, in a case of charging the capacitor, and
  - a discharging-path selecting unit that selects a discharging path including a connection member electrically connecting two neighboring battery stacks of the plurality of battery stacks, the capacitor and the branch line in a case of discharging the capacitor.

* * * * *